Figure 1:
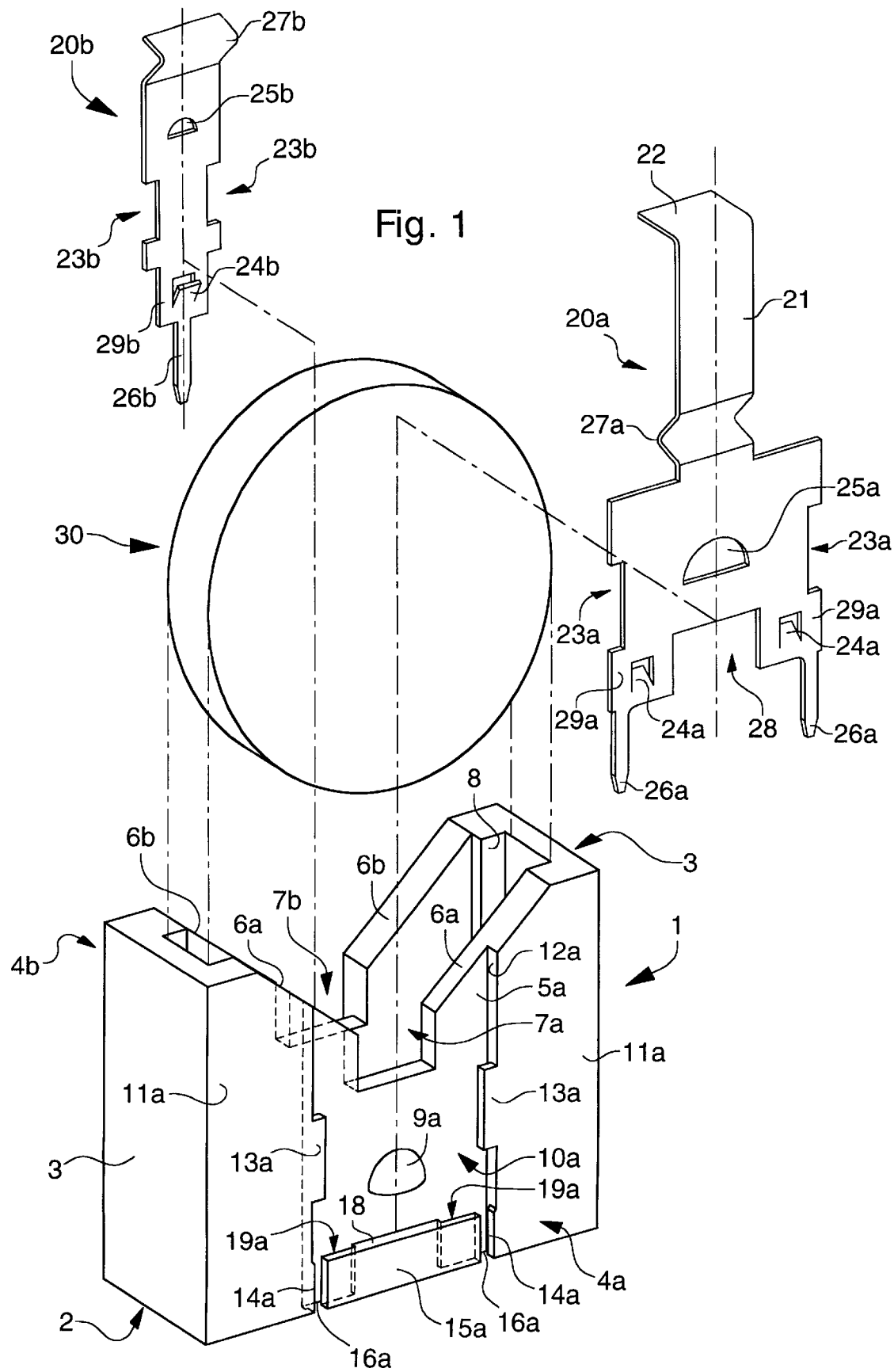

United States Patent [19]
Rieder

[11] Patent Number: 6,087,037
[45] Date of Patent: Jul. 11, 2000

[54] VERTICALLY POSITIONED SUPPORT FOR A BUTTON TYPE BATTERY

[75] Inventor: Stefan Rieder, Bretzwil, Switzerland

[73] Assignee: Renata A.G., Itingen, Switzerland

[21] Appl. No.: 09/425,202

[22] Filed: Oct. 22, 1999

[30] Foreign Application Priority Data

Oct. 23, 1998 [EP] European Pat. Off. .............. 98120044

[51] Int. Cl.[7] .................................................. H01M 2/10
[52] U.S. Cl. .............................. 429/99; 429/100; 439/500
[58] Field of Search ..................... 429/99, 100; 439/500; H01M 2/10

[56] References Cited

U.S. PATENT DOCUMENTS 5,823,820  10/1998  Patel et al. .

FOREIGN PATENT DOCUMENTS

| | | |
|---|---|---|
| 903314 | 1/1986 | Belgium . |
| 2292635 | 2/1996 | United Kingdom . |
| 97/08764 | 3/1997 | WIPO . |
| 98/19354 | 5/1998 | WIPO . |

*Primary Examiner*—John S. Maples
*Attorney, Agent, or Firm*—Sughrue, Mion, Zinn, Macpeak & Seas, PLLC

[57] ABSTRACT

The support includes a parallelepiped container (1) whose large vertical walls (4a, 4b) each have a recess (10a, 10b) for vertically fixing from the exterior a metal contact clamp (20a, 20b) between the battery (30) and a flat surface. Each recess (20a, 20b) is separated from the inside of the container (1) by a wall (5a, 5b) having a cut out communication portion (7a, 7b) in which a bent portion (27a, 27b) of the clamp engages. The recesses (10a, 10b) and the clamps (20a, 20b) have complementary snap fitting means (13a, 13b, 23a, 23b) and anchoring means (24a, 24b, 25a, 25b, 9a, 9b). The positive clamp (20a) is extended by a tongue (21) of which the end (22) which is bent and possibly insulated, holds in place one or two batteries. The container (1) is manufactured simply and economically in one or more parts by moulding or injecting a plastic material.

10 Claims, 3 Drawing Sheets

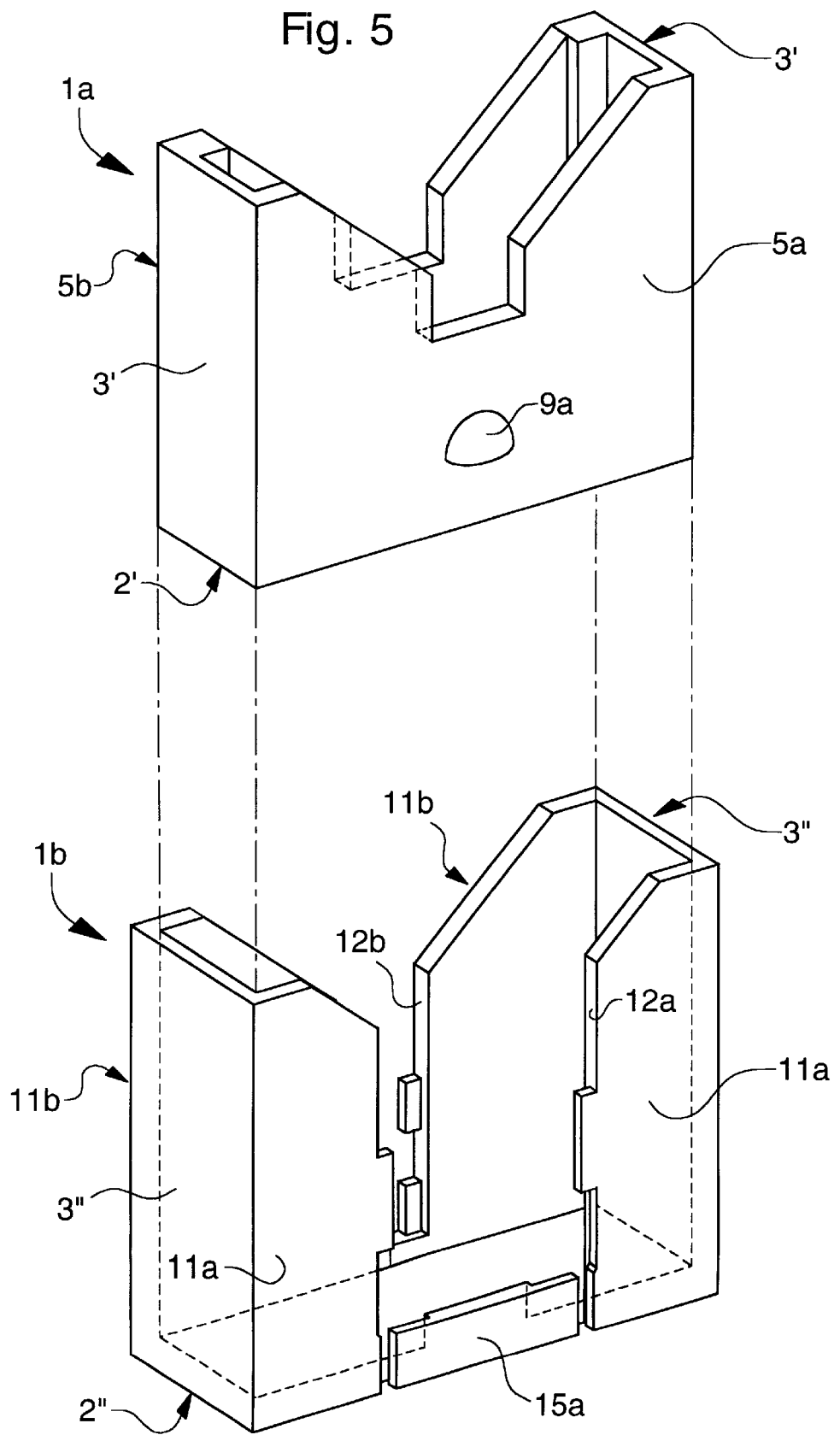

VERTICALLY POSITIONED SUPPORT FOR A BUTTON TYPE BATTERY

The present invention concerns a support for a button type battery, which can be vertically positioned on a flat surface such as a printed circuit board.

Because of their compact nature, button type batteries are very widely used as a source of electric power for the integrated circuits of electronic apparatus.

In electronic watches, button type batteries are always arranged horizontally, either in a recess arranged in the printed circuit arranged within the case, or in a recess provided in the back cover of the case sealed by a cover to make replacement of the battery easier when it is worn out. The connections of the battery terminals to the electronic circuit are achieved by means of metal clamps, permanently fixed to the printed circuit or to the frame, and resiliently contacting one or other of the faces of the button type battery or the edge of its case.

For electronic apparatus of slightly larger dimensions, such as mobile telephones or computers, it has appeared more advantageous economically to manufacture separately a printed circuit and a battery container, then to assemble these two elements mechanically and electrically. In the development of existing technology for electronic watches, such containers are generally designed to allow horizontal positioning of the button type battery on a printed circuit. The junction clamps between the printed circuit and the battery are formed by metal strips having relatively complex cut out portions and bends, said strips being fixed in place from the inside of the case. Such an arrangement is for example shown by the container disclosed in GB Patent No. 2 292 635. Horizontal positioning has the advantage of requiring less space in height and giving the container good stability, which can be further increased by the addition of catches formed in the container, as disclosed for example in WO Patent No. 97/44836.

A horizontal arrangement of this type has however at least two drawbacks. The space occupied on the printed circuit is relatively significant, which contributes to increasing the cost of the end product while the space available in the vertical direction in such apparatus is generally quite sufficient to position vertically a container intended to accommodate a button type battery. The setting in place, and especially the removal of the button type battery are quite awkward, even if the container has one face which is entirely, or partially, open towards the exterior. Certain manufacturers, such as Sony Electronics Inc., propose in their range of products containers able to be positioned vertically, but whose conformation is substantially the same as that of horizontally positioned containers, with the exception of fixing lugs for the contact clamps which have additional or different bent portions. Such containers have the same drawbacks as those previously mentioned as regards mounting the clamps from the inside of the container and setting in place/removing the battery.

An object of the present invention is to avoid the aforementioned drawbacks as a result of a vertically positioned container having battery clamps of simple shape which are able to be mounted on said container from its outer surface.

The invention therefore concerns a button type battery support which can be vertically positioned on a flat surface including:
- a container made of insulating material, open upwards and delimited by a rectangular base, two small walls and two large vertical walls, and
- a first metal clamp and a second metal clamp attached to said container to connect electrically the positive and negative poles of the battery to contacts arranged on the flat surface.

Each large wall of the container is provided with a recess for securing a clamp vertically from the exterior. This recess is formed on the one hand of a separating wall including a cut out portion communicating with the inside of the container and on the other hand of two vertical strips connecting the small walls and of a horizontal strip connecting the base, said strips being parallel to the separating wall. These strips delimit an opening towards the exterior while forming snap fitting means for the clamp and vertical shoulders which will be used for guiding. The horizontal strip is further provided with at least one passage passing through the base and beyond it. The clamp is formed by a flexible metal strip extended at one of its ends by at least one connecting lug engaged in a through passage, having in the vicinity of the cut out communication portion a deformed portion which is bent towards the inside of the container, and having on each of its edges snap fitting means complementary to the those of the strips, but offset vertically with respect thereto to allow the clamp to be set in place by sliding it from the top to the bottom.

According to a preferred embodiment, the complementary snap fitting means are formed simply and economically by at least one rectangular extension of the edge of each vertical strip and by at least one notch of the same dimensions made in each edge of the clamp, whose maximum width substantially corresponds to the distance between the vertical shoulders on each side of the recess. The clamp is made of a flexible metal and in order to mount it in the recess, the notches and the rectangular extensions are made to coincide, then the clamp is slid along the vertical shoulders until it stops against the bottom of the recess, which modifies the relative position of the notches and the extensions and allows vertical positioning of each clamp.

Even if it is possible to make a friction adjustment between the bottom of the shoulder and the edges of the clamp, according to another aspect of the invention the vertical movement of the clamp is prevented by providing anchoring means thereon which will for example resist the pressure transmitted by the lugs during fixing of the support onto a printed circuit. By way of non limiting example, these anchoring means consist of a tongue cut out of the clamp and bent towards the separating wall, or a raised portion formed in the separating wall and engaging in a recess made in the clamp. It is of course possible to use several different anchoring means at the same time.

The clamps can have the same configuration and each have only one connecting lug. It is however advantageous to be able to differentiate, according to a known principle, between the positive pole of the battery, generally by providing two connecting lugs, and the negative pole which includes only one.

It will also be noted that, unlike horizontally positioned supports, the connecting lugs are at a distance from any bent or deformed zone, which allows their relative position, with respect to the contacts of the printed circuit in which they will have to be engaged, to be fixed more precisely.

In order to keep the button type battery in place within the container, it is possible to provide a cover which fits or snaps, for example onto the rectangular extensions of the edge of the recess. However, according to a preferred embodiment which avoids the manufacture of an additional part, the button type battery is held in the container by bending a tongue extending the positive clamp beyond the bent portion to establish contact with a face of the battery.

In the event that one wishes to obtain a higher output voltage, replacing a button type battery by two button type batteries in series together having the same thickness as the single battery is known in the art. According to another aspect of the invention this object is easily achieved by providing an insulating sleeve on the bent portion of the tongue, i.e. without any fundamental modification of the battery support.

Likewise, providing a battery recess exactly adapted to the asymmetrical dimensions of button type battery, whose cover always has a smaller diameter than that of the case, is also known. In button type battery supports such as those cited at the beginning with respect to the prior art, whether they are vertically or horizontally positioned, the portion of the container accommodating the battery can be shaped exactly to the dimensions of said battery, but the elastic strip resting on one of its faces to hold it in place does not totally prevent insertion with an inversion of polarity. According to another aspect of the invention, the inside of the container includes two edges totally preventing the insertion of a battery in a non suitable direction.

Figure 2:
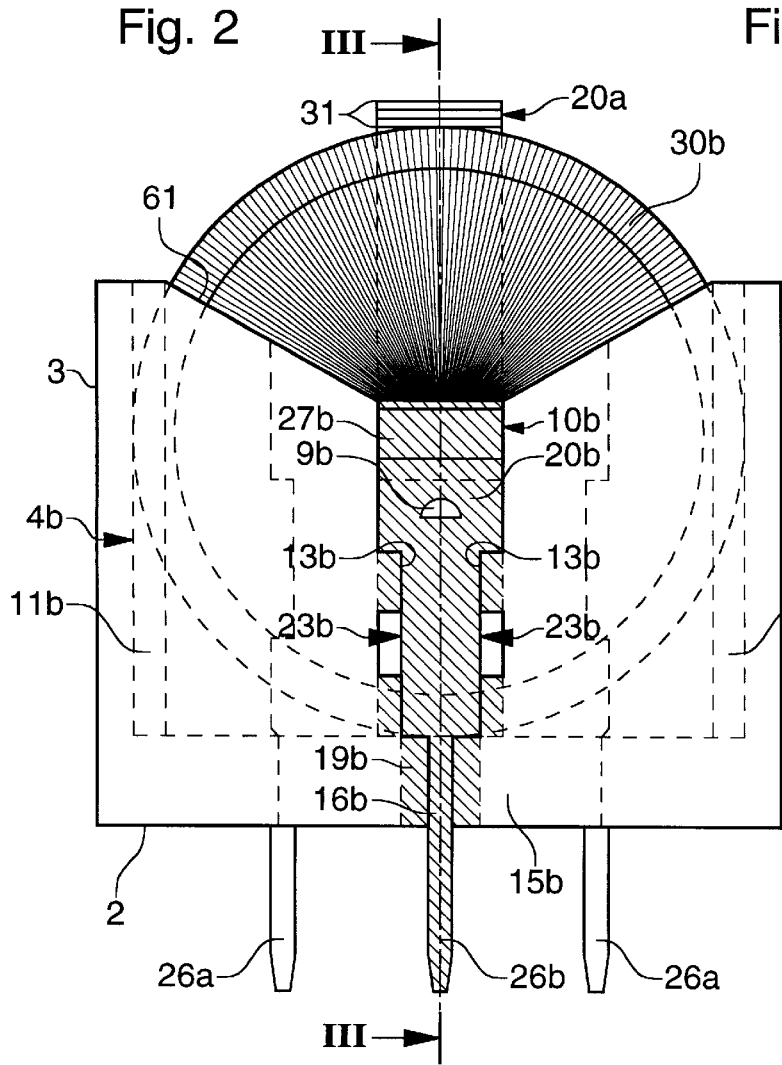
Figure 3:
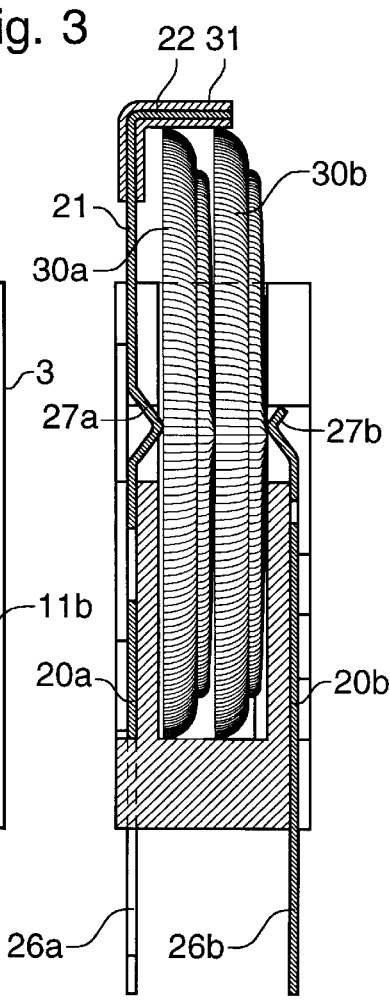
Figure 4:
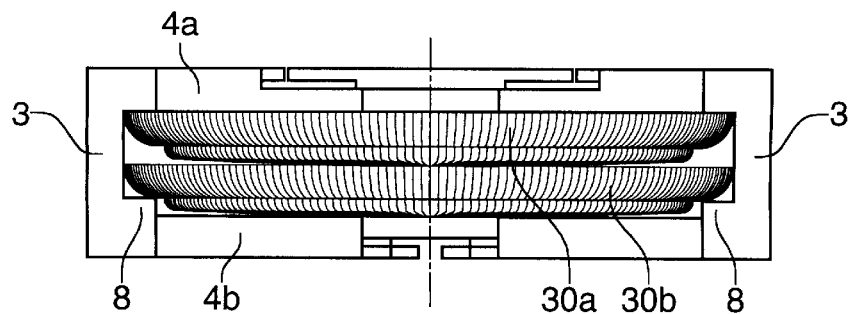

Other features and advantages of the present invention will appear in the following description of an embodiment given by way of non limiting example, with reference to the annexed drawings, in which:

FIG. 1 is a blown up perspective view of a support according to the invention intended to accommodate a button type battery, FIG. 2 is a front view, on the side of the negative clamp, of a support according to the invention intended to accommodate one or two button type batteries, FIG. 3 is a cross-section along the line III—III of FIG. 2, FIG. 4 is a top view of the support shown in FIG. 2, in which the connecting clamps are not shown, and FIG. 5 is an exploded perspective view of a container obtained by assembling the two parts.

FIG. 1 shows an exploded view of a button type battery support including a container 1, two connecting clamps 20a, 20b and a button type battery 30. Container 1 is obtained by moulding or injecting a plastic material in a single part or in several subsequently assembled parts as will be explained hereinafter. This container 1 allows two connecting clamps 20a, 20b to be fixed from the exterior, allowing a battery 30 to be electrically connected when it is inserted into container 1. Container 1 has a generally parallelepiped shape, rectangular base 2 being surmounted by two small walls 3, and by two large walls 4a, 4b (visible in FIG. 2) which each include a recess 10a (respectively 10b not visible in FIG. 1). With reference only to recess 10a, intended to accommodate a clamp 20a having two connecting lugs 26a, it can be seen that it is formed by a separating wall 5a which separates recess 10a from the inside of container 1, and which includes a cut out communication portion 7a, of substantially rectangular shape and symmetrical with respect to the median plane parallel to small walls 3 of container 1. This cut out communication portion 7a is extended symmetrically by inclined planes 6a which join the upper edges of the opening of container 1. Towards the exterior, the contour of recess 10a is delimited by two vertical strips 11a which join small walls 3 and which have a symmetrical configuration with respect to the median plane parallel to small walls 3, and by a horizontal strip 15a which joins base 2, said strips 11a, 15a being parallel to separating wall 5a. Each vertical strip 11a is applied against separating wall 5a, or is integral with the latter, forming on each edge oriented towards the middle of recess 10a a vertical shoulder 12a which will act as a guide for the edges of clamp 20a.

The edge of each strip 11a is not rectilinear but has at least one extension oriented towards the median axis of recess 10a. In the example shown, there exists on the edge of each strip 11a a first rectangular extension 13a in the median portion, and a second extension 14a of smaller dimensions in the portion joining base 2. These extensions 13a, 14a will allow a clamp 20a to be snap fitted thereon, as will be explained hereinafter, and the number and geometrical shape thereof are not determining factors within the scope of the present invention; the same object would be achieved, for example, by a succession of serrated extensions.

Horizontal strip 15a is applied over a portion 18 of its length, against separating wall 5a or is integral therewith, arranging, on the facing sides of vertical strips 11a and as far as separating wall 5a, a through passage 16a which opens into base 2 of container 1. This horizontal strip 15a further includes, on each side of through passages 16a, rabbets 19a which are closed on the outside and the spacing of which with respect to separation wall 5a substantially corresponds to the thickness of clamp 20a.

Clamp 20a is formed by a metal strip provided with two connecting lugs 26a at one of its ends, and extended at the other end by a narrower tongue 21, having in the vicinity of the connection with the strip a bent portion 27a and having its end 22 bent at 90° to hold battery 30 in place. Each edge of the strip includes a notch 23a having the same shape as the corresponding extension 13a, which is thus rectangular in this example. The lower portion of the strip further includes a cut out portion 28, of a complementary shape to portion 18 of strip 15a which delimits on either side two strip portions 29a which will engage in rabbets 19a. As is seen in FIG. 1, clamp 20a also includes anchoring means which will permanently fix said clamp 20a after it has been set in place in recess 10a. Mainly, these anchoring means are formed by small tongues 24a cut out of portions 29a of the strip and bent towards separating wall 5a. These small tongues 24a could of course be provided in other locations of the strip, and in a greater number, or even be cut out of the edges of the strip in contact with shoulders 12a (not shown in FIG. 1). By way of complement or alternative, the strip can include a recess 25a, for example a semi-circular recess, which will engage on a raised portion 9a formed on separating wall 5a. It will be noted that the strip can perfectly well include a recess 25a, without a corresponding raised portion 9a, said recess still being useful in an automated chain assembly of the battery support for feeding and setting in place the clamp.

Clamp 20b is made in a similar manner, but includes only one connecting lug 26b and does not have a tongue extending beyond bent portion 27b.

Large wall 4b, not visible in the perspective view of FIG. 1, is shown in front view in FIG. 2, in which clamps 20a, 20b are set in place, as well as two button type batteries 30a, 30b arranged in series. This large wall 4b has a similar construction to that which has just been described but differs therefrom in that recess 10b is designed to accommodate a clamp 20b which is narrower than clamp 20a and includes only one connecting lug 26b. To aid comprehension, the contour of the opening of recess 10b is shown in a bold continuous line and the entire surface of clamp 20b, in the visible and non visible portions is hatched.

Lower strip 15b has only one through passage 16a in a central position. Rabbets 19b are arranged on each side of passage 16b so that each strip portion 15b, on either side of passage 16a, is in fact just an extension of vertical strips 11b. FIG. 2 also shows clearly that, after assembly of clamp 20b in recess 10b, the complementary snap fitting means, i.e. rectangular extensions 13b and corresponding notches 23b are offset axially and that lower portion 29b of clamp 20b is engaged in rabbets 19b.

With reference now to FIGS. 2 and 3, it can be seen that the button type battery support which has just been described can house two button type batteries 30a, 30b and that bent end 22 of tongue 21 is then covered with an insulating sleeve 31. The electric bridge between the two batteries 30a, 30b in series is then effected solely by the contacts established respectively on the positive and negative poles, by bent portions 27a, 27b of the two clamps 20a, 20b.

FIG. 4, which is a top view corresponding to FIG. 2, without clamps 20a, 20b, shows even more clearly than FIG. 1 how ribs 8 prevent the insertion of one or two button type batteries in a non suitable direction.

As has been stated, the battery support according to the invention can be manufactured very economically. Connecting clamps 20a, 20b are obtained from a strip or a metal plate by stamping or machining operations which are well known to those skilled in the art and which will not be described further.

Container 1 can be obtained in a single part by moulding or by injecting a plastic material, but it can be more advantageous economically for the manufacture of the mould to manufacture it by assembly of two or more parts. By way of example, FIG. 5 shows a container such as that which has just been described, obtained by fitting together two parts 1a, 1b, formed by moulding or injecting a plastic material. The first inner part 1a includes separating walls 5a, 5b, a semi-base 2', two small semi-walls 3'. The second outer part includes strips 11a, 15a, 11b, 15b forming recesses 10a, 10b, a semi-base 2" and small semi-walls 3". These semi construction elements have substantially half the thickness desired for corresponding walls 2, 3 after assembly.

What is claimed is:

1. A support for a button type battery which can be vertically positioned on a flat surface including:
   a container made of insulating material, open upwards and delimited by a rectangular base, two small walls and two large vertical walls, and
   a first metal clamp and a second metal clamp attached to said container to connect electrically the positive and negative poles of the battery to contacts arranged on the flat surface,
wherein each large wall is provided with a recess for securing a clamp vertically from the outside of the container, said recess being formed on the one hand of a separating wall including a cut out portion communicating with the inside of the container and on the other hand of two vertical strips connecting the small walls and of a horizontal strip connecting the base, said strips being parallel to the separating wall and delimiting an opening and forming shoulder guide means and snap fitting means for the clamp, said horizontal strip being further provided with at least one passage passing through the base and beyond it and said clamp being formed by a flexible metal strip extended at one of its ends by at least one connecting lug engaged in a through passage, having in the vicinities of the cut out communication portion a deformed portion which is bent towards the inside of the container, and having on each of its edges snap fitting means complementary to the those of the strips, but offset vertically with respect thereto to allow the clamp to be set in place by sliding it from the top to the bottom.

2. A button type battery support according to claim 1, wherein the complementary snap fitting means are formed by at least one rectangular extension from the edge of each vertical strip of the recess and by at least one rectangular notch of the same dimensions made in the edges of the clamp.

3. A button type battery support according to claim 1, wherein each clamp further includes anchoring means such as a tongue which is cut out and bent towards the separating wall or a recess in which a raised portion formed in the separation wall engages.

4. A button type battery support according to claim 1, wherein the clamps which establishes the electric junctions each includes a single connecting lug.

5. A button type battery support according to claim 1, wherein the clamp connecting the negative pole of the battery includes a connecting lug and the clamp connecting the positive pole includes two connecting lugs.

6. A button type battery support according to claim 1, wherein the clamp which establishes the contact with the base of a battery case is extended by a tongue an end of which is bent to hold the button type battery in place within the container.

7. A button type battery support according to claim 6, wherein the bent end is covered with an insulating sleeve, allowing two button type batteries to be placed in series in a same support.

8. A button type battery support according to claim 1, wherein two angles within the container, situated on a same side of a separating wall include two ribs fitted to the asymmetrical nature of the button type battery.

9. A button type battery support according to claim 1, wherein the container is obtained in a single part by moulding or injecting a plastic material.

10. A button type battery support according to claim 1, wherein the container is formed of two parts which fit together, obtained by moulding or injecting a plastic material, a first inner part including the separation walls, a semi base and small semi walls and a second outer part including the strips forming the recesses, a semi base and small semi walls the semi elements forming, after assembly, the base and the small walls.

* * * * *